United States Patent
Seo et al.

(10) Patent No.: US 11,107,681 B2
(45) Date of Patent: Aug. 31, 2021

(54) METHOD OF FABRICATING SEMICONDUCTOR DEVICE BY REMOVING MATERIAL ON BACK SIDE OF SUBSTRATE

(71) Applicant: Samsung Electronics Co., Ltd., Suwon-si (KR)

(72) Inventors: Ji Youn Seo, Seoul (KR); Ji Woon Im, Hwaseong-si (KR); Dai Hong Kim, Suwon-si (KR); Ik Soo Kim, Yongin-si (KR); Sang Ho Rha, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 28 days.

(21) Appl. No.: 16/578,245

(22) Filed: Sep. 20, 2019

(65) Prior Publication Data
US 2020/0211847 A1    Jul. 2, 2020

(30) Foreign Application Priority Data

Dec. 26, 2018  (KR) ........................ 10-2018-0169321

(51) Int. Cl.
*H01L 21/033*    (2006.01)
*H01L 21/02*    (2006.01)

(52) U.S. Cl.
CPC ...... *H01L 21/0337* (2013.01); *H01L 21/0209* (2013.01); *H01L 21/02087* (2013.01); *H01L 21/02115* (2013.01); *H01L 21/0332* (2013.01)

(58) Field of Classification Search
CPC ............. H01L 21/0337; H01L 21/0332; H01L 21/0209; H01L 21/02087; H01L 21/02115; H01L 21/033; H01L 21/67103; H01L 21/302; H01L 21/02271; C23C 16/00

See application file for complete search history.

(56) References Cited

U.S. PATENT DOCUMENTS

| 5,075,256 | A | * | 12/1991 | Wang ................. H01L 21/0209 438/716 |
| 5,707,485 | A | * | 1/1998 | Rolfson ............ H01J 37/32431 438/716 |
| 6,059,985 | A | | 5/2000 | Yoshimura et al. |

(Continued)

FOREIGN PATENT DOCUMENTS

| JP | 06-120175 A | 4/1994 |
| KR | 10-0900703 B1 | 5/2009 |
| WO | WO 2008/108604 A1 | 9/2008 |

*Primary Examiner* — John P. Dulka
(74) *Attorney, Agent, or Firm* — Muir Patent Law, PLLC

(57) ABSTRACT

A method of fabricating a semiconductor device and a semiconductor processing apparatus are provided. The method of fabricating a semiconductor device comprises preparing a semiconductor substrate having a front side and a back side, opposing each other, and forming a material layer on the semiconductor substrate. The material layer is formed on at least a portion of the back side of the semiconductor substrate while being formed on the front side of the semiconductor substrate. The material layer formed on the at least a portion of the back side of the semiconductor substrate is removed, while the material layer formed on the front side of the semiconductor substrate remains. A semiconductor process is performed to fabricate the semiconductor device using the material layer remaining on the front side of the semiconductor substrate.

18 Claims, 12 Drawing Sheets

(56) References Cited

U.S. PATENT DOCUMENTS

| | | |
|---|---|---|
| 7,909,960 B2 | 3/2011 | Kim et al. |
| 7,910,484 B2 * | 3/2011 | Dziobkowski .... H01L 21/02164 |
| | | 438/694 |
| 8,138,444 B2 | 3/2012 | Kim |
| 8,575,037 B2 * | 11/2013 | Friza ................... B81C 1/00047 |
| | | 438/761 |
| 8,592,712 B2 | 11/2013 | Fujisato et al. |
| 9,428,833 B1 | 8/2016 | Duvall et al. |
| 9,796,582 B1 * | 10/2017 | Cheng ..................... H01L 21/82 |
| 9,881,788 B2 * | 1/2018 | Kim .................. H01J 37/32715 |
| 2002/0036343 A1 | 3/2002 | Moriya et al. |
| 2003/0235824 A1 * | 12/2003 | Trulson ................ C12Q 1/6837 |
| | | 435/6.11 |
| 2009/0156013 A1 * | 6/2009 | Yousif ............... H01J 37/32357 |
| | | 438/725 |
| 2009/0297731 A1 | 12/2009 | Goundar |
| 2012/0161257 A1 * | 6/2012 | Friza ..................... G01L 9/0042 |
| | | 257/416 |
| 2012/0176680 A1 * | 7/2012 | Ahadian ........... H01L 27/14685 |
| | | 359/601 |
| 2014/0037116 A1 * | 2/2014 | Friza .................... H04R 19/005 |
| | | 381/175 |
| 2019/0295855 A1 * | 9/2019 | Ojha ........................ B23H 7/26 |
| 2020/0043719 A1 * | 2/2020 | Mori ................. H01J 37/32532 |
| 2020/0090946 A1 * | 3/2020 | Citla ................. H01J 37/32357 |
| 2020/0098702 A1 * | 3/2020 | Sheng ................ C23C 14/0652 |
| 2020/0211847 A1 * | 7/2020 | Seo ....................... H01L 21/302 |
| 2020/0350160 A1 * | 11/2020 | Zhou ................ H01L 21/67745 |

* cited by examiner

METHOD OF FABRICATING SEMICONDUCTOR DEVICE BY REMOVING MATERIAL ON BACK SIDE OF SUBSTRATE

CROSS-REFERENCE TO RELATED APPLICATION

This application claims benefit of priority to Korean Patent Application No. 10-2018-0169321 filed on Dec. 26, 2018 in the Korean Intellectual Property Office, the disclosure of which is incorporated herein by reference in its entirety.

BACKGROUND

1. Field

The present inventive concept relates to a method of fabricating a semiconductor device, and more particularly, to a method of fabricating a semiconductor device and a semiconductor processing apparatus using a back side of a semiconductor substrate.

2. Description of Related Art

In general, an integrated circuit is formed on a front surface of a semiconductor substrate. Such an integrated circuit may generally be formed by repeatedly performing a semiconductor process such as a deposition process, a photolithography process, and an etching process on the front side of the semiconductor substrate. However, a warpage phenomenon of the semiconductor substrate becomes an important issue, since the depositing process and the etching process should repeatedly be performed on the front side layer while forming the front patterns thereon in order to form the integrated circuit on the front side of the semiconductor substrate.

SUMMARY

An aspect of the present inventive concept is to provide a method of fabricating a semiconductor device using a back side of a semiconductor substrate.

According to an aspect of the present inventive concept, a method of fabricating a semiconductor device is provided. The method of fabricating a semiconductor device comprises preparing a first semiconductor substrate having a front side and a back side, opposing each other, and forming a material layer on the first semiconductor substrate. The material layer is formed on at least a portion of the back side of the first semiconductor substrate while being formed on the front side of the first semiconductor substrate. The material layer formed on the at least a portion of the back side of the first semiconductor substrate is removed, while the material layer formed on the front side of the first semiconductor substrate remains. A semiconductor process is performed to fabricate the semiconductor device using the material layer remaining on the front side of the first semiconductor substrate.

According to an aspect of the present inventive concept, a method of fabricating a semiconductor device is provided. The method of fabricating a semiconductor device comprises preparing a semiconductor substrate having a front side and a back side, opposing each other. A front side layer is formed on the front side of the semiconductor substrate. A back side layer is formed on the back side of the semiconductor substrate. A material layer is formed on the semiconductor substrate on which the front side layer and the back side layer are formed. The material layer is formed on the front side of the semiconductor substrate and formed on at least a portion of the back side of the semiconductor substrate. The material layer formed on the front side of the semiconductor substrate remains, while the material layer formed on the at least a portion of the back side of the semiconductor substrate is removed. A semiconductor process is performed to fabricate the semiconductor device using the material layer remaining on the front side of the semiconductor substrate.

According to an aspect of the present inventive concept, a method of fabricating a semiconductor device is provided. The method of fabricating a semiconductor device comprises preparing a first back side process chamber and a second back side process chamber. Each of the first and second back side process chambers includes a lower showerhead having lower holes, an upper showerhead disposed on the lower showerhead and having upper holes, and a support structure between the lower showerhead and the upper showerhead. A first semiconductor substrate having a front side and a back side, opposing each other, is loaded into the first back side process chamber. The back side of the first semiconductor substrate faces the lower showerhead in the first back side process chamber, and the front side of the first semiconductor substrate faces the upper showerhead in the first back side process chamber. A back side layer is formed on the back side of the first semiconductor substrate in the first back side process chamber. The first semiconductor substrate on which the back side layer is formed is unloaded from the first back side process chamber. A material layer is formed on the first semiconductor substrate. The material layer covers the front side of the first semiconductor substrate and covers at least a portion of the back side of the first semiconductor substrate. The first semiconductor substrate on which the material layer is formed is loaded into the second back side process chamber, wherein the back side of the first semiconductor substrate on which the material layer is formed faces the lower showerhead in the second back side process chamber, and the front side of the first semiconductor substrate on which the material layer is formed faces the upper showerhead in the second back side process chamber. The material layer formed on the at least a portion of the front side of the first semiconductor substrate remains, while the material layer formed on the back side of the first semiconductor substrate is removed, in the second back side process chamber. The first semiconductor substrate in which the material layer remains on the front side is unloaded from the second back side process chamber.

According to an aspect of the present inventive concept, a semiconductor processing equipment is provided. The semiconductor processing apparatus comprises a lower showerhead; an upper showerhead on the lower showerhead; a support structure disposed between the lower showerhead and the upper showerhead to support a semiconductor substrate. The lower showerhead faces a back side of the semiconductor substrate supported by the support structure, and the upper showerhead faces a front side of the semiconductor substrate supported by the support structure. A process region between the lower showerhead and the back side of the semiconductor substrate supported by the support structure is disposed. An upper gas supply unit configured to supply an upper gas is disposed. An upper gas pipeline connecting the upper gas supply unit to the upper showerhead is disposed. A deposition process gas supply unit configured to supply a deposition process gas is disposed. An etching process gas supply unit configured to supply an etching process gas is disposed. A deposition process gas pipeline connecting the deposition process gas supply unit to the lower showerhead is disposed. An etching process gas pipeline connecting the etching process gas supply unit to the lower showerhead is disposed. The upper showerhead includes upper holes spraying the upper gas supplied from the upper gas supply unit toward the front side of the semiconductor substrate supported by the support structure, and the lower showerhead includes lower holes spraying the deposition process gas supplied from the deposition process gas supply unit or the etching process gas supplied from the etching process gas supply unit into the process region.

BRIEF DESCRIPTION OF DRAWINGS

The above and other aspects, features, and advantages of the present inventive concept will be more clearly understood from the following detailed description, taken in conjunction with the accompanying drawings.

DETAILED DESCRIPTION

Figure 1:
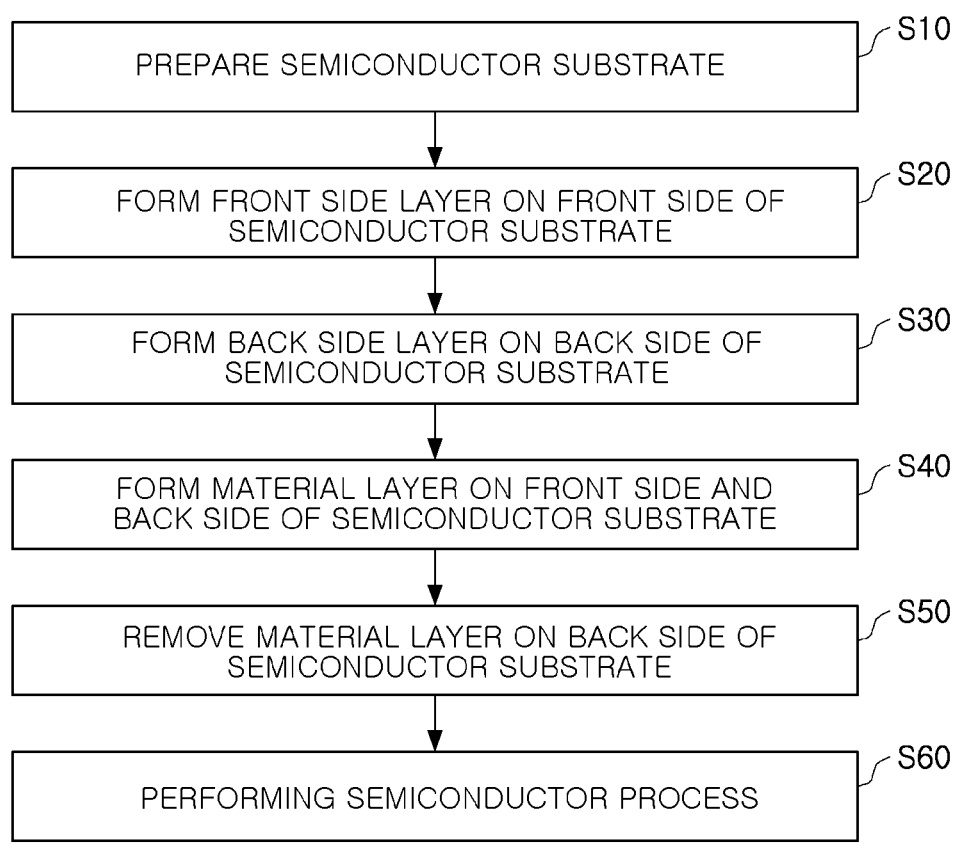
FIG. 1 is a process flow chart illustrating a method of fabricating a semiconductor device according to example embodiments of the present inventive concept.
Figure 2:
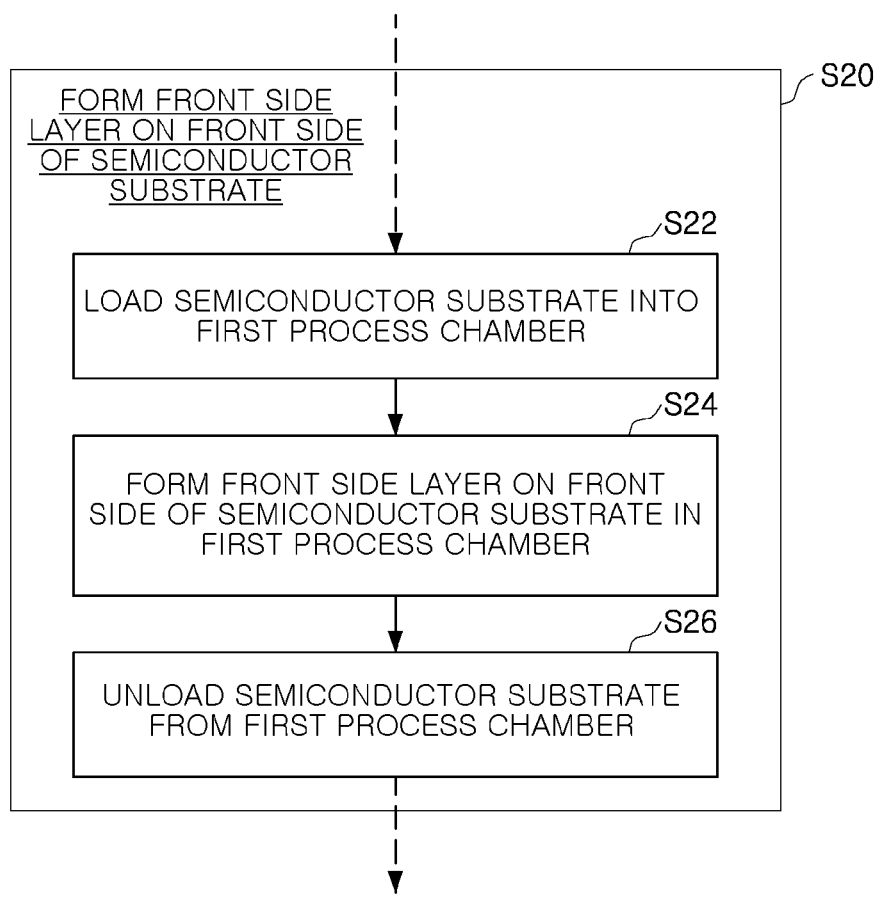
FIG. 2 is a process flow chart illustrating a portion of a method of fabricating a semiconductor device according to example embodiments of the present inventive concept.

Hereinafter, example embodiments of the present inventive concept will be described with reference to the accompanying drawings.

In the drawings and specification, the terms such as "first," "second," "third," "fourth," and the like may be used to describe various components, but the components are not limited to such terms. The terms "first," "second," "third," "fourth," and the like may be used for the purpose of distinguishing one element from another. For example, a "first component" may be named a "second component" without departing from the scope of the present inventive concept.

In the drawings and specification, in order to distinguish a "first process chamber," a "second process chamber," a "third process chamber," and a "fourth process chamber" from one another, the term "first process chamber" may be used interchangeably with the term "front side process chamber," which refers to a process chamber in which a process performs on a "front side" of a semiconductor substrate; the term "second process chamber" may be used interchangeably with the term "back side process chamber," which refers to a process chamber in which a process performs on a "back side" of a semiconductor substrate; the term "third process chamber" may be used interchangeably with the term "batch type process chamber," which refers to a process chamber in which a plurality of semiconductor substrates are collectively processed; and the term "fourth process chamber" may be used interchangeably with the term "edge process chamber," which refers to a process chamber in which a process performs on an edge region of a semiconductor substrate. For example, a process performing on a "front side" of a semiconductor substrate refers to depositing a material on the "front side" of the semiconductor substrate, etching the "front side" of the semiconductor substrate, or etching a material formed on the "front side" of the semiconductor substrate. Further, a process performing on a "back side" of a semiconductor substrate refers to depositing a material on the "back side" of the semiconductor substrate, or etching a material formed on the "back side" of the semiconductor substrate.

In the drawings and specification, a "front side" of a semiconductor substrate may be a side of a semiconductor substrate on which an integrated circuit of a semiconductor device, memory cells of a flash memory device, or memory cells of a dynamic random access memory DRAM device are formed. A "back side" of the semiconductor substrate may be a side opposing the front side of the semiconductor substrate.

Hereinafter, a method of fabricating a semiconductor device according to an embodiment of the present inventive concept will be described with reference to FIGS. 1 to 6, 7A, 7B, and 8 to 17.

Referring to FIGS. 1 to 4, a semiconductor substrate 10 may be prepared (S10). The semiconductor substrate 10 may be a semiconductor wafer that may be formed of a semiconductor material such as silicon. The semiconductor substrate 10 may include a front side 10F and a back side 10B, opposing each other. The semiconductor substrate 10 may include a lateral surface 10S extending from and connecting the front side 10F and the back side 10B. The semiconductor substrate 10 may include a chip region 10C and an edge region 10E. For example, the chip region 10C may be a region used for forming a semiconductor chip or a semiconductor device in the semiconductor substrate 10, and the edge region 10E may be a region surrounding the chip region 10C, or a dummy region around the chip region 10C. For example, a plurality of semiconductor chips or a plurality of semiconductor devices are included in the chip region 10C of the semiconductor substrate 10.

A first process chamber 100 may be prepared. In one embodiment, the first process chamber 100 may include a substrate support chuck 110 and a processing space 120. In some examples, a plurality of semiconductor substrates 10 (e.g., 2, 4, . . . 8, etc.) is processed in the first process chamber 100 at the same time.

A front side layer 15 may be formed on the front side 10F of the semiconductor substrate 10 (S20). The front side layer 15 may be used to form an integrated circuit that constitutes a semiconductor device. In some examples, the front side layer 15 may be a mold layer used to form memory cell gate electrodes of a vertical NAND flash memory device, or a mold layer used to form memory cell capacitors of a DRAM device. In some examples, the front side layer 15 may be one of a plurality of layers used to form memory devices such as the vertical NAND flash memory device or the DRAM device.

The operation of forming the front side layer 15 on the front side 10F of the semiconductor substrate 10 (S20) may include an operation of loading the semiconductor substrate 10 into the first process chamber 100 (S22), an operation of forming the front side layer 15 on the front side 10F of the semiconductor substrate 10 in the first process chamber 100 (S24), and an operation of unloading the semiconductor substrate 10 from the first process chamber 100 (S26).

As described above, the first process chamber 100 may be referred to as a front side process chamber. Hereinafter, the first process chamber 100 will be referred to as a 'front side process chamber.'

In the front side process chamber 100, the semiconductor substrate 10 may be loaded onto the substrate support chuck 110 of the front side process chamber 100, the back side 10B of the semiconductor substrate 10 may contact the substrate support chuck 110, and the front side 10F of the semiconductor substrate 10 may be exposed by the processing space 120. Two or more semiconductor substrates 10 (e.g., 4, 8, etc.) may be simultaneously loaded in the front side process chamber 100. The front side process chamber 100 may be a deposition process chamber capable of conducting a chemical vapor deposition (CVD) process or an atomic layer deposition (ALD) process. The CVD process or the ALD process using the front side process chamber 100 may be performed, such that the front side layer 15 may be formed on the front side 10F of the semiconductor substrate 10 exposed by the processing space 120.

Figure 6:
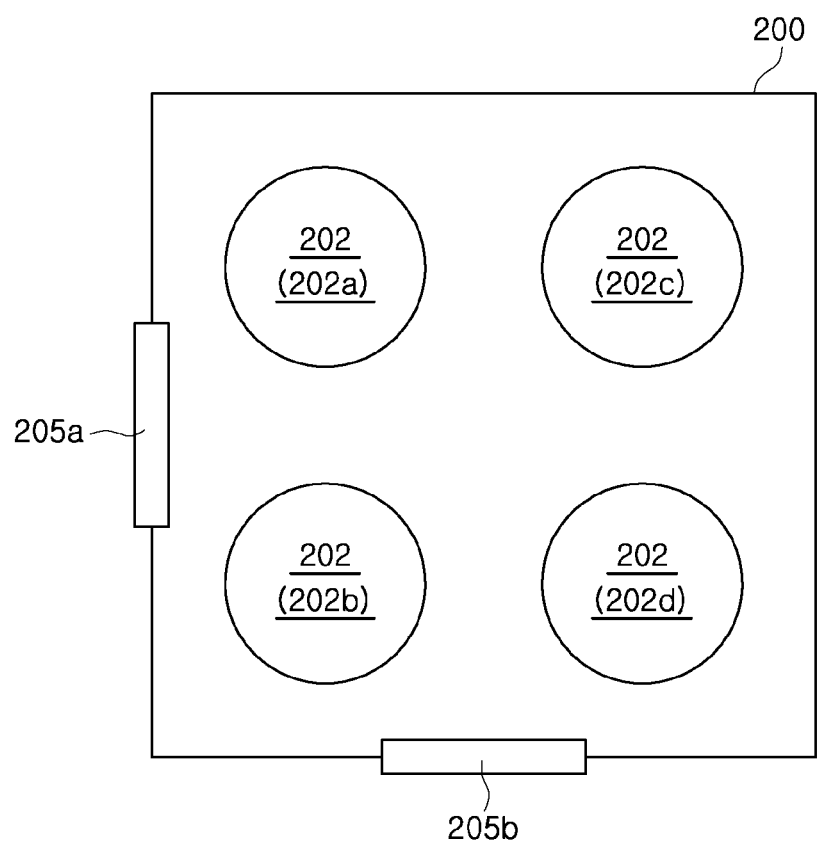
FIG. 6 is a top view conceptually illustrating an example embodiment of a second process chamber used to form a semiconductor device according to example embodiments of the present inventive concept.
Figure 7A:
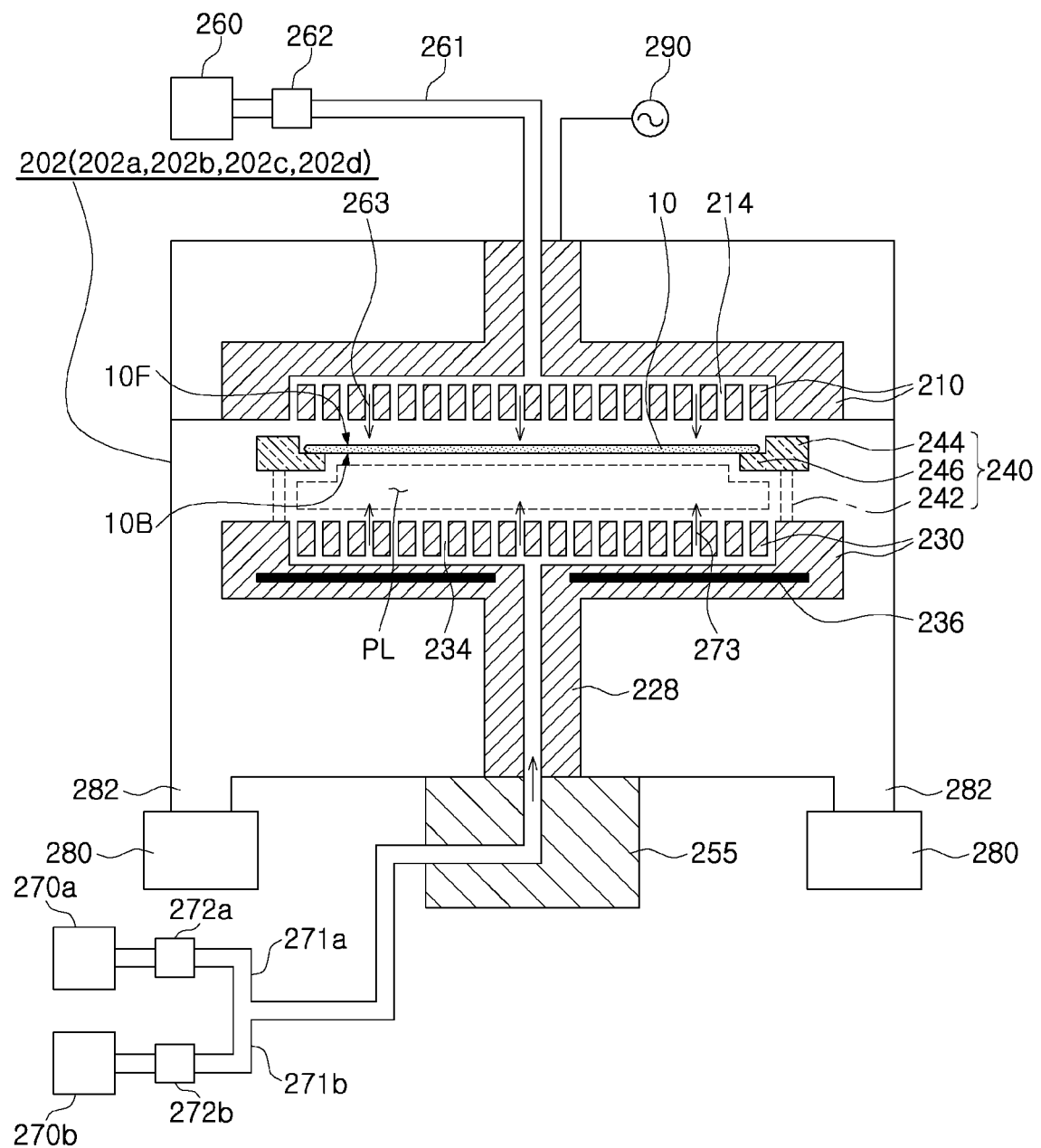
FIG. 7A is a cross-sectional view conceptually illustrating an example embodiment of an apparatus including a second process chamber used to form a semiconductor device according to example embodiments of the present inventive concept.
Figure 7B:
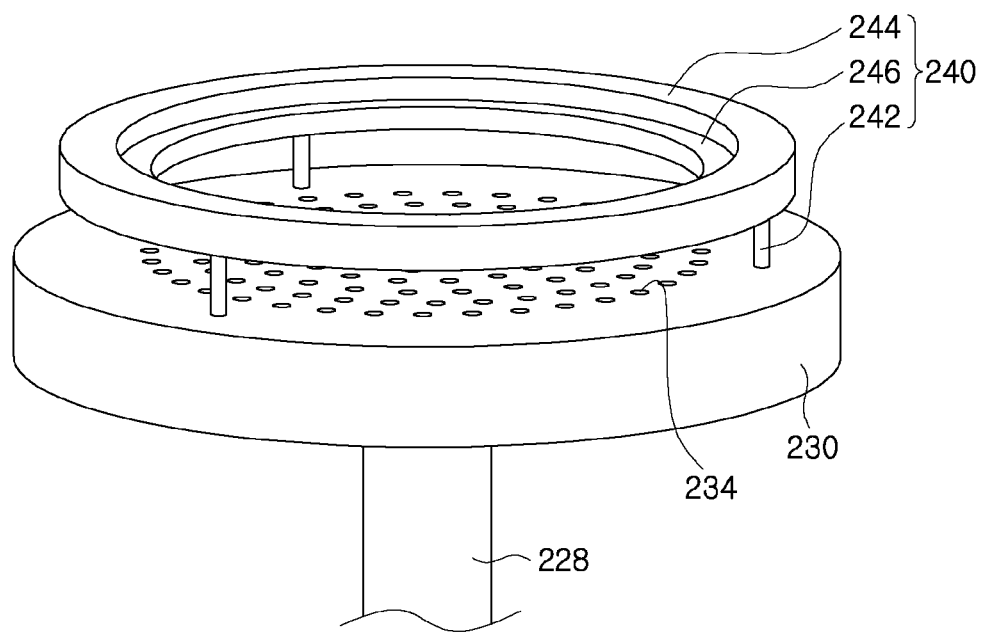
FIG. 7B is a perspective view conceptually illustrating a portion of a second process chamber used to form a semiconductor device according to example embodiments of the present inventive concept.

Referring to FIGS. 6, 7A and 7B, a semiconductor processing apparatus 200 including a second process chamber 202 may be prepared. As mentioned above, the second process chamber 202 may be referred to as a 'back side process chamber.' Hereinafter, the second process chamber 202 will be referred to as a 'back side process chamber.'

In an example embodiment, in the semiconductor processing apparatus 200, the back side process chamber 202 may be included in plural. For example, the plurality of back side process chambers 202a, 202b, 202c, and 202d may be disposed in the semiconductor processing apparatus 200. The semiconductor processing apparatus 200 may include one or a plurality of gates 205a and/or 205b capable of loading/unloading the semiconductor substrate 10 into the back side process chamber 202.

Each of the back side process chambers 202a, 202b, 202c, and 202d may include an upper showerhead 210, a lower showerhead 230, and a support structure 240. The upper showerhead 210 may have upper holes 214. The lower showerhead 230 may have lower holes 234. The upper showerhead 210 may be disposed on or in a position higher than a position of the lower showerhead 230, and may face the lower showerhead 230.

Each of the back side process chambers 202a, 202b, 202c, and 202d may further include a lower shaft axis 228 connected to the lower showerhead 230 beneath the lower showerhead 230, and a structure 255 connected to the lower shaft axis 228. The lower shaft axis 228 may move the lower showerhead 230 and the support structure 240 in an upward/downward direction, by the structure 255, which may include a motor.

Each of the back side process chambers 202a, 202b, 202c, and 202d may further include a lower heater 236 disposed inside the lower showerhead 230. The lower heater 236 may adjust a process temperature in a process region PL.

The support structure 240 may be coupled to the lower showerhead 230, and may be spaced apart from the upper showerhead 210. The support structure 240 may include a ring body 244, a plurality of ring support axes 242 extending downwardly from the ring body 244 and connected to the lower showerhead 230, and a substrate supporting portion 246 extending from a lower portion of the ring body 244 toward an imaginary central point of the ring body 244 to support the semiconductor substrate 10. The ring body 244 and the substrate supporting portion 246 may be arranged between the upper showerhead 210 and the lower showerhead 230. The substrate supporting portion 246 may support a portion of the back side 10B of the semiconductor substrate 10, and may expose the remainder of the back side 10B of the semiconductor substrate 10. A space between the lower showerhead 230 and the semiconductor substrate 10 supported by the substrate supporting portion 246 may be defined as the 'process region PL.' The process region PL may expose the back side 10B of the semiconductor substrate 10 not in contact with the substrate supporting portion 246.

The semiconductor processing apparatus 200 may include an upper gas supply 260 for supplying an upper gas 263 into each of the back side process chambers 202a, 202b, 202c, and 202d, an upper gas pipeline 261 connecting the upper gas supply 260 and the upper showerhead 210 in each of the back side process chambers 202a, 202b, 202c, and 202d of the upper showerhead 210, and an upper gas flow rate controller 262 for controlling a flow rate of an upper gas 263 supplied by the upper gas supply 260 and sprayed through the upper holes 214 of the upper showerhead 210. The upper gas flow rate controller 262 may be disposed in the upper gas pipeline 261.

The semiconductor processing apparatus 200 may include a first lower gas supply unit 270a and a second lower gas supply unit 270b for supplying a lower gas 273 to each of the back side process chambers 202a, 202b, 202c, and 202d.

The semiconductor processing apparatus 200 may include a first lower gas pipeline 271a connecting the first lower gas supply unit 270a and the lower showerhead 230 in each of the back side process chambers 202a, 202b, 202c, and 202d, and a second lower gas pipeline 271b connecting the second lower gas supply unit 270b and the lower showerhead 230 in each of the back side process chambers 202a, 202b, 202c, and 202d.

A first lower gas flow rate controller 272a may be disposed in the first lower gas pipeline 271a. The first lower gas flow rate controller 272a may control a flow rate of the lower gas 273 supplied from the first lower gas supply unit 270a and sprayed through the lower holes 234 of the lower showerhead 230. A second lower gas flow rate controller 272b may be disposed in the second lower gas pipeline 271b. The second lower gas flow rate controller 272b may control a flow rate of the lower gas 273 supplied from the second lower gas supply unit 270b and sprayed through the lower holes 234 of the lower showerhead 230.

The first lower gas supply unit 270a may supply a deposition process gas used in a deposition process, and the second lower gas supply unit 270b may supply an etching process gas used in an etching process. Therefore, the lower gas 273, supplied from the first lower gas supply unit 270a and sprayed into the process region PL through the lower holes 234 of the lower showerhead 230, may be the deposition process gas to be used in the deposition process, and the lower gas 273, supplied from the second lower gas supply unit 270b and sprayed into the process region PL through the lower holes 234 of the lower showerhead 230, may be the etching process gas to be used in the etching process. Therefore, the first lower gas supply unit 270a may be described as a 'deposition process gas supply unit,' the second lower gas supply unit 270b may be described as an 'etching process gas supply unit,' the first lower gas pipeline 271a may be described as a 'deposition process gas pipeline,' the second lower gas pipeline 271b may be described as an 'etching process gas pipeline,' the first lower gas flow controller 272a may be described as a 'deposition process gas flow controller,' and the second lower gas flow controller 272b may be described as an 'etching process gas flow controller.'

The upper gas 263 and the lower gas 273 sprayed between the lower showerhead 230 and the upper showerhead 210 may be discharged through a discharge portion 282 disposed in a lower region of the second process chamber 202. The discharge portion 282 may be connected to a vacuum pump 280, and the upper gas 263 and the lower gas 273 sprayed between the lower showerhead 230 and the upper showerhead 210 may be discharged by a vacuum suction force generated by the vacuum pump 280.

In an example embodiment, each of the back side process chambers 202a, 202b, 202c, and 202d may include a power supply 290 for generating a plasma in the process region PL. Therefore, a process using the lower gas 273 supplied from the first lower gas supply unit 270a may be a plasma deposition process, and a process using the lower gas 273 supplied from the second lower gas supply unit 270b may be a plasma etching process. Therefore, each of the back side process chambers 202a, 202b, 202c, and 202d may be a process chamber in which a plasma deposition process is performed, or may be a process chamber in which a plasma etching process is performed, depending on a kind of gas supplied from the first and second lower gas supply units 270a and 270b. In some examples, the lower gas 273 is an oxygen ($O_2$).

Figure 5:
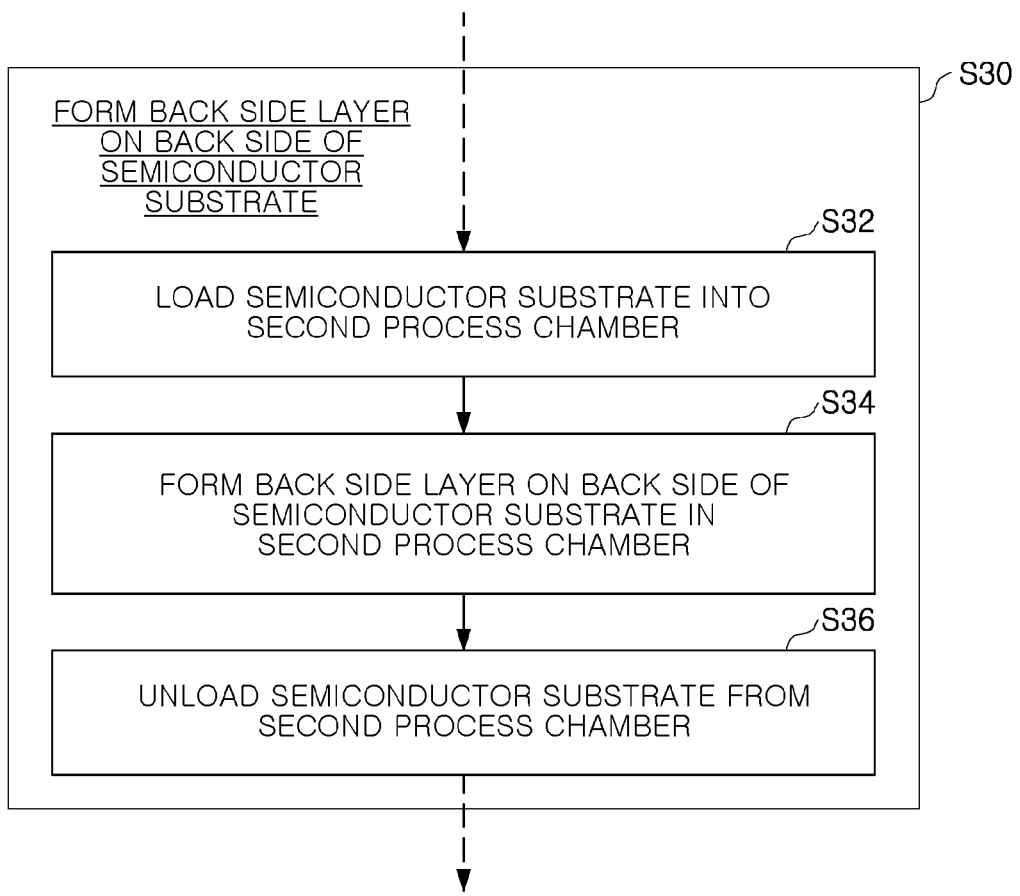
FIG. 5 is a process flow chart illustrating a portion of a method of fabricating a semiconductor device according to example embodiments of the present inventive concept.
Figure 8:
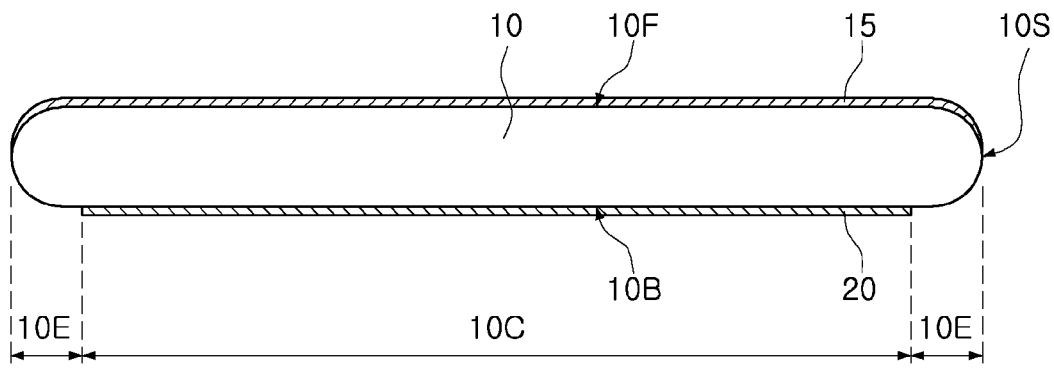
Figure 9:
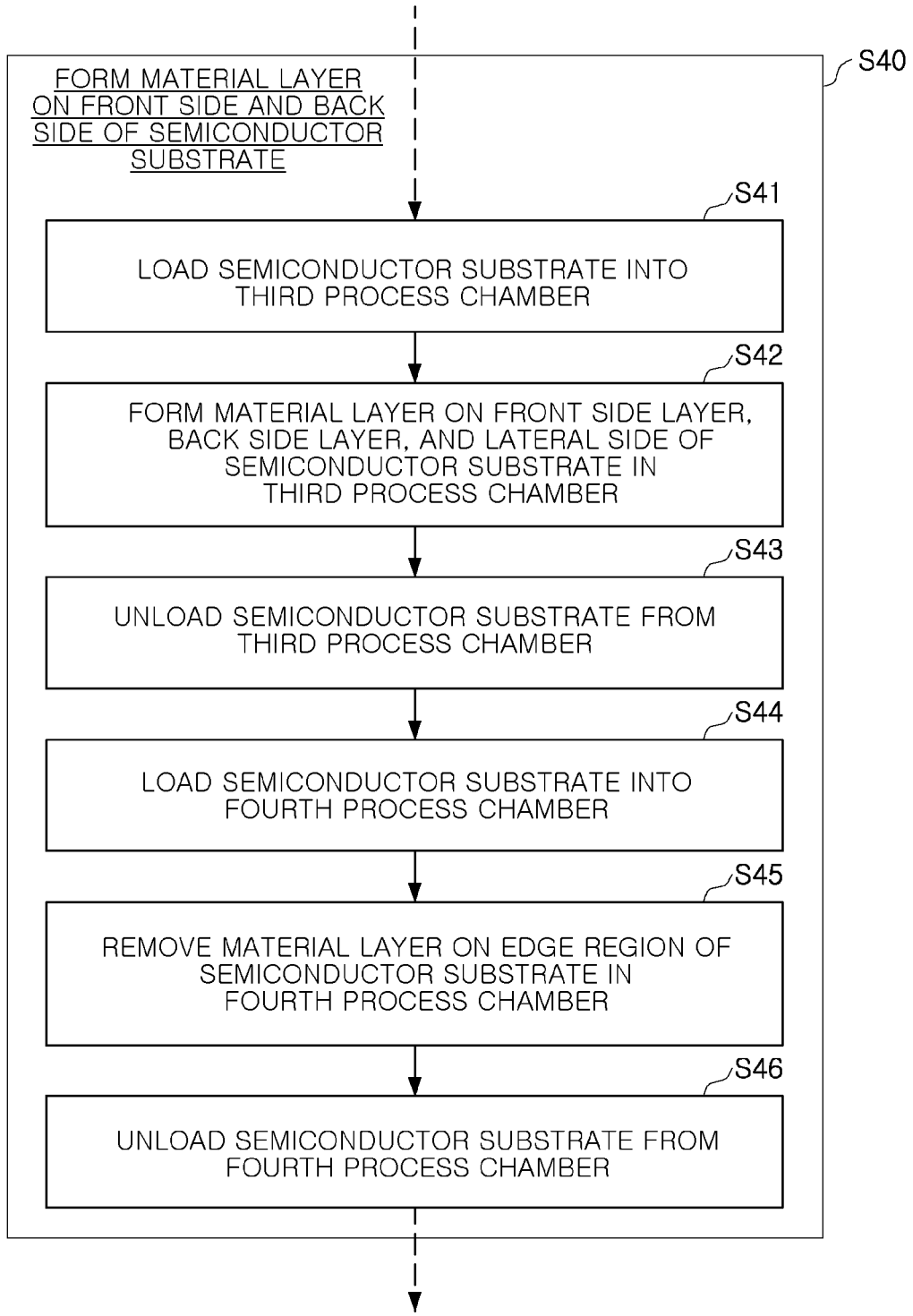
FIG. 9 is a process flow chart illustrating a portion of a method of fabricating a semiconductor device according to example embodiments of the present inventive concept.
Figure 10:
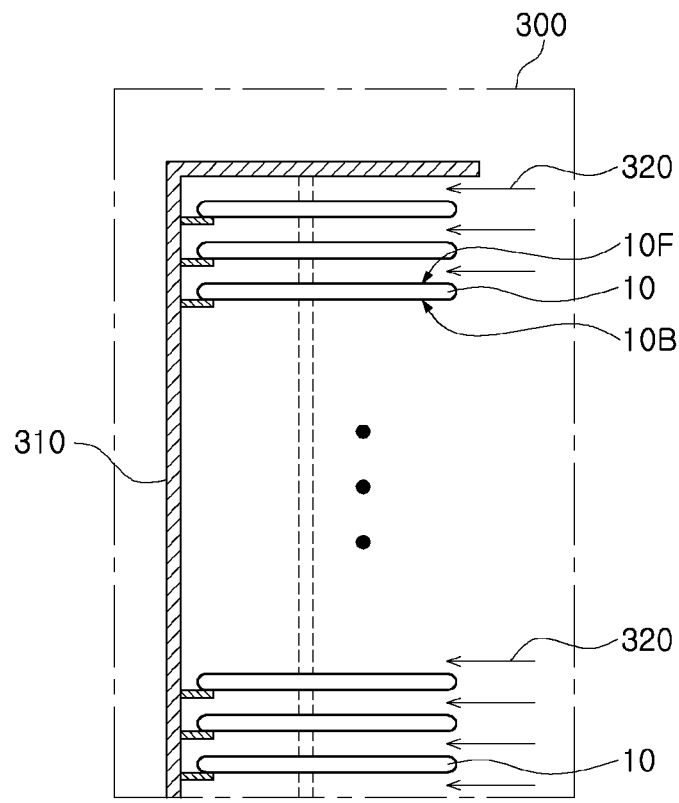
FIG. 10 is a cross-sectional view conceptually illustrating an example embodiment of an apparatus including a third process chamber used to form a semiconductor device according to example embodiments of the present inventive concept.
Figure 11:
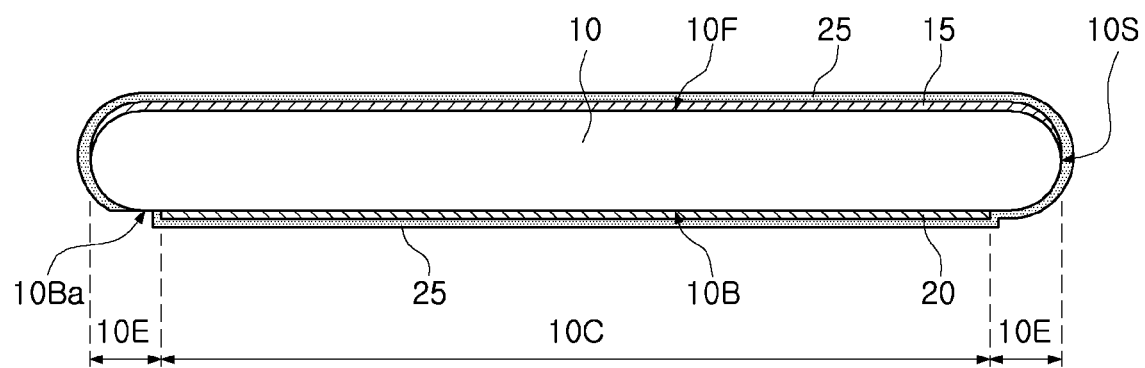
Figure 12:
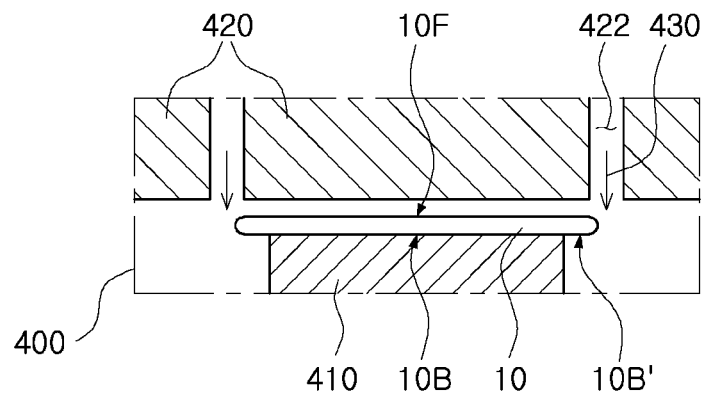
FIG. 12 is a cross-sectional view conceptually illustrating an example embodiment of an apparatus including a fourth process chamber used to form a semiconductor device according to example embodiments of the present inventive concept.
Figure 13:
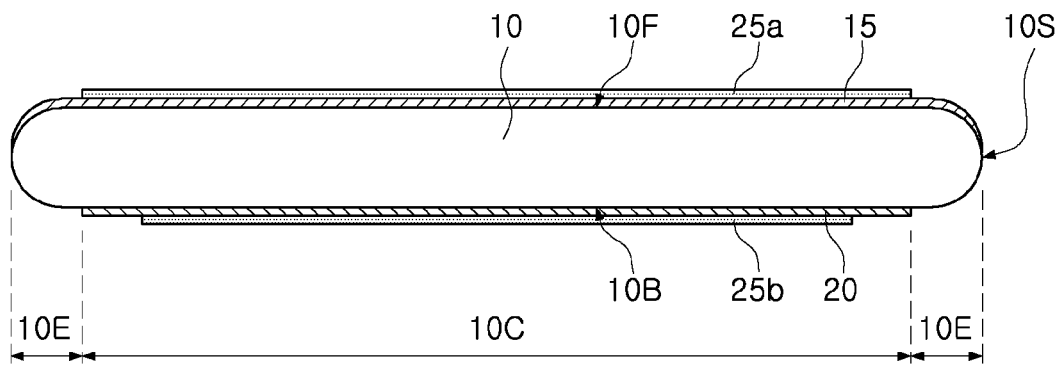

Referring to FIGS. 1, 5, and 8 together with FIGS. 6, 7A, and 7B, a back side layer 20 may be formed on the back side 10B of the semiconductor substrate 10 (S30). The back side layer 20 may be formed of an insulating material or a conductive material. The back side layer 20 may be formed using the second process chamber 202 described above. Such a second process chamber 202 may be referred to as a back side process chamber, as previously described above. Hereinafter, a first back side process chamber 202a among the plurality of back side process chambers 202a, 202b, 202c, and 202d described above will be mainly described. Here, the first back side process chamber 202a may be used in the deposition process using the lower gas 273 supplied from the first lower gas supply unit 270a.

The operation of forming the back side layer 20 on the back side 10B of the semiconductor substrate 10 (S30) may include an operation of loading the semiconductor substrate 10 into the second process chamber 202, e.g., the first back side process chamber 202a (S32), an operation of forming the back side layer 20 on the back side 10B of the semiconductor substrate 10 in the first back side process chamber 202a (S34), and an operation of unloading the semiconductor substrate 10 from the first back side process chamber 202a (S36).

The operation of forming the back side layer 20 on the back side 10B of the semiconductor substrate 10 in the first back side process chamber 202a may include providing an upper gas 263 in a direction from the upper holes 214 of the upper showerhead 210 toward the front side 10F of the semiconductor substrate 10 in the first back side process chamber 202a, to protect the front side 10F of the semiconductor substrate 10; and using a lower gas 273 provided in a direction from the lower holes 234 of the lower showerhead 230 toward the back side 10B of the semiconductor substrate 10 in the first back side process chamber 202a, to form the back side layer 20 on the back side 10B of the semiconductor substrate 10. Here, the upper gas 263 may be an inert gas to be provided onto the front side 10F of the semiconductor substrate 10 to prevent the front side 10F of the semiconductor substrate 10 from being affected by the lower gas 273.

In other embodiments, the forming of the back side layer 20 on the back side 10B of the semiconductor substrate 10 performs before forming the front side layer 15.

Referring to FIGS. 1, 9, 10, and 11, a third process chamber 300 may be prepared. A material layer 25 may be formed on the semiconductor substrate 10 on which the front side layer 15 and the back side layer 20 are formed. The material layer 25 may be formed on the front side 10F of the semiconductor substrate 10, and may be formed on at least a portion of the back side 10B of the semiconductor substrate 10. Therefore, the material layer 25 may be formed on the front side 10F and the back side 10B of the semiconductor substrate 10 (S40). The operation of forming the material layer 25 on the front side 10F and the back side 10B of the semiconductor substrate 10 (S40) may include an operation of loading the semiconductor substrate 10 into the third process chamber 300 (S41), an operation of forming the material layer 25 on the front side 10F, the back side 10B, and the lateral surface 10S of the semiconductor substrate 10 in the third process chamber 300 (S42), and an operation of unloading the semiconductor substrate 10 from the third process chamber 300 (S43).

In an example embodiment, the material layer 25 may be an amorphous carbon layer. For example, the material layer 25 may be formed on the semiconductor substrate 10 by performing an amorphous carbon deposition process using a process gas containing hydrocarbon gas in the third process chamber 300. For example, the material layer 25 may be formed of an amorphous carbon layer.

In an example embodiment, the third process chamber 300 may be a 'batch type process chamber.' Hereinafter, the third process chamber 300 will be referred to as a 'batch type process chamber.'

In an embodiment, the semiconductor substrate 10 may be prepared in plural, prior to loading the semiconductor substrate 10 into the batch type process chamber 300. Therefore, a plurality of semiconductor substrates 10 may be loaded into the batch type process chamber 300. The number of the semiconductor substrates 10 loaded in the batch type process chamber 300 may be several tens or several hundreds.

The batch type process chamber 300 may include a substrate support 310 capable of supporting the plurality of semiconductor substrates 10. For example, the batch type process chamber 300 may be a vertical batch type deposition process chamber, and the substrate support 310 may be a vertical wafer boat.

In an example embodiment, the plurality of semiconductor substrates 10 may be stacked while being spaced apart from each other in a vertical direction. In the batch type process chamber 300, a portion 10Ba of the back side 10B of each of the plurality of semiconductor substrates 10 may contact the substrate support 310. In the batch type process chamber 300, a portion 10Ba of the back side 10B of the semiconductor substrate 10 may contact the substrate support 310, the remainder of the back side 10B of the semiconductor substrate 10 may be exposed, and the front side 10F and the lateral surface 10S of the semiconductor substrate 10 may be exposed.

In the batch type process chamber 300, a process gas 320 supplied onto the front side 10F and the back side 10B of each of the plurality of semiconductor substrates 10 may be used to form the material layer 25 on the exposed front side 10F, the exposed back side 10B, and the exposed lateral surface 10S of each of the plurality of semiconductor substrates 10.

Figure 3:
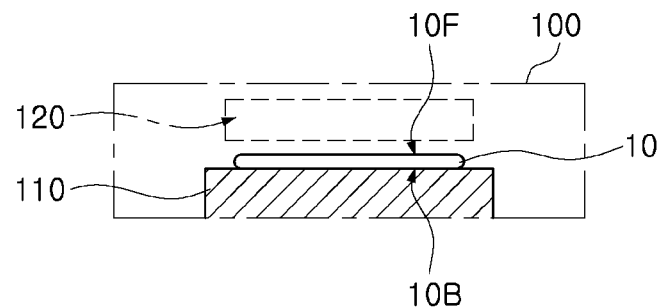
FIG. 3 is a cross-sectional view conceptually illustrating an example embodiment of a first process chamber used to form a semiconductor device according to example embodiments of the present inventive concept.
Figure 4:
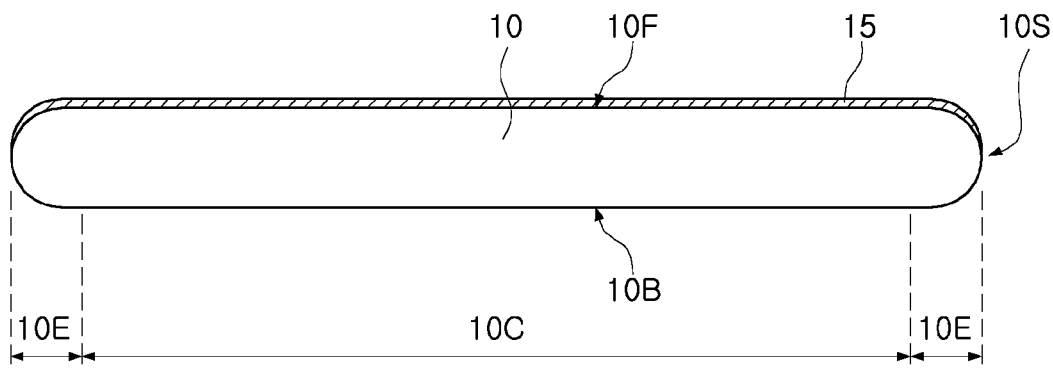
FIGS. 4, 8, 11, 13, 15, 16, and 17 are cross-sectional views schematically illustrating a method of fabricating a semiconductor device according to example embodiments of the present inventive concept.

In another embodiment, the third process chamber 300 may be a 'front side process chamber' as in FIG. 3. For example, when the third process chamber 300 is a front side process chamber, the material layer 25 may be formed on the front side 10F of the semiconductor substrate 10, and the material layer 25 may cover the lateral surface 10S of the semiconductor substrate 10, and may pass through onto the back side 10B of the semiconductor substrate 10 to cover at least a portion of the back side 10B of the semiconductor substrate 10.

Referring to FIGS. 1, 9, 12, and 13, a fourth process chamber 400 may be prepared. An operation of forming the material layer 25 on the front side 10F and the back side 10B of the semiconductor substrate 10 (S40) may further include an operation of loading the semiconductor substrate 10 unloaded from the third process chamber 300 into the fourth process chamber 400 (S44), an operation of removing the material layer 25 on the edge region 10E of the semiconductor substrate 10 in the fourth process chamber 400 (S45), and an operation of unloading the semiconductor substrate 10 from the fourth process chamber 400 (S46).

As described above, the fourth process chamber 400 may be an edge process chamber. Therefore, the fourth process chamber 400 will be referred to as an edge process chamber.

The edge process chamber 400 may include a substrate chuck 410 supporting the semiconductor substrate 10, and an upper structure 420 facing the substrate chuck 410, and the substrate chuck 410 may contact a portion of the material layer 25 of the back side 10B of the semiconductor substrate 10. For example, the substrate chuck 410 contacting the material layer 25 may have a width narrower than a width of the back side 10B of the semiconductor substrate 10. Therefore, the material layer 25 formed on a portion 10B' of the back side 10B of the semiconductor substrate 10 may be exposed.

The upper structure 420 may include an upper hole 422. The upper hole 422 may be disposed on at least a portion of the edge region 10E of the semiconductor substrate 10. The material layer 25 formed on the edge region 10E of the semiconductor substrate 10 may be etched and removed by performing an etching process using a process gas 430 provided from the upper hole 422. Since the substrate chuck 410 in contact with the material layer 25 may have a width narrower than a width of the back side 10B of the semiconductor substrate 10, the material layer 25 formed on the portion 10B' of the back side 10B of the semiconductor substrate 10 may be removed. The front side 10F of the semiconductor substrate 10 may be blocked from the process gas 430 while the process gas 430 is provided from the upper hole 422.

In an example embodiment, the process gas 430 is an oxygen ($O_2$). Thus, the material layer 25 such as an amorphous carbon layer formed on the edge region 10E of the semiconductor substrate 10 may be removed by an etching process using an oxygen ($O_2$) plasma.

The material layer 25 formed on the front side 10F, the back side 10B, and the side face 10S of the semiconductor substrate 10 may be formed as a front material layer 25a remaining on the front side 10F of the semiconductor substrate 10, and as a back material layer 25b remaining on the back side 10B of the semiconductor substrate 10, by way of etching and removing a portion of the material layer 25 by the edge process chamber 400.

Figure 14:
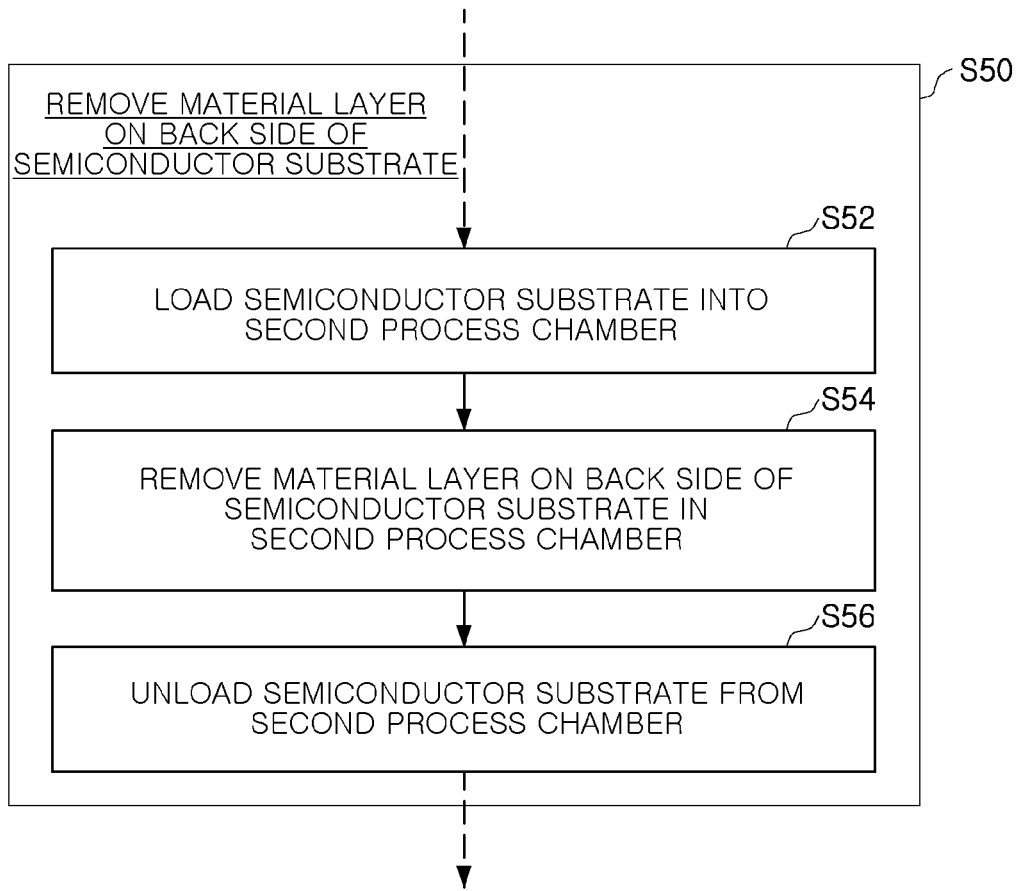
FIG. 14 is a process flow chart illustrating a portion of a method of fabricating a semiconductor device according to example embodiments of the present inventive concept.
Figure 15:
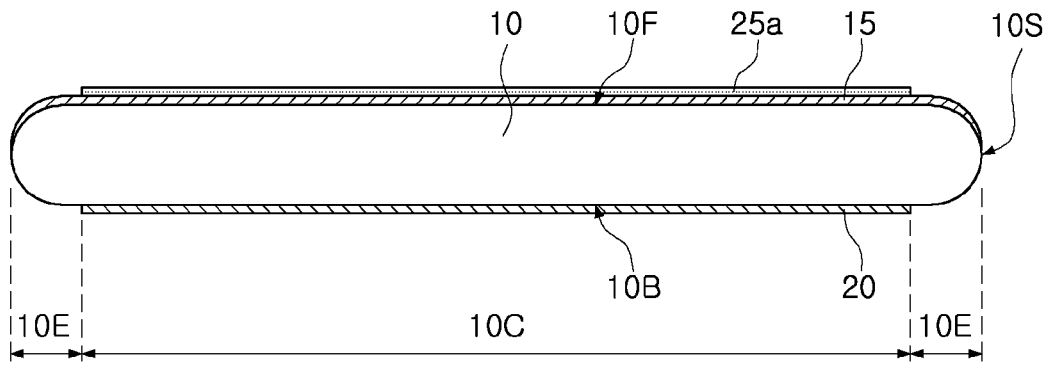

Referring to FIGS. 1, 14, and 15 together with FIGS. 6, 7A, and 7B, the material layer 25 on the back side 10B of the semiconductor substrate 10 may be removed (S50). The material layer 25 on the back side 10B of the semiconductor substrate 10 may be the back material layer 25b remaining on the back side 10B of the semiconductor substrate 10. The operation of removing the material layer 25, i.e., the back material layer 25b, on the back side 10B of the semiconductor substrate 10 (S50) may utilize the second process chamber 202 described above. The second process chamber 202 used herein may be any one of the plurality of the back side process chambers 202a, 202b, 202c, and 202d described above, for example, a second back side process chamber 202b.

The operation of removing the back material layer 25b on the back side 10B of the semiconductor substrate 10 may include an operation of loading the semiconductor substrate 10 into the second process chamber 202, for example, the second back side process chamber 202b (S52), an operation of removing the back material layer 25b on the back side 10B of the semiconductor substrate 10 in the second process chamber 202b (S54), and an operation of unloading the semiconductor substrate 10 from the second process chamber 202b (S56).

The operation of removing the back material layer 25b on the back side 10B of the semiconductor substrate 10 in the second process chamber 202b may include providing an upper gas 263 in a direction from the upper holes 214 of the upper showerhead 210 toward the front side 10F of the semiconductor substrate 10 in the second back side process chamber 202b, to protect the front material layer 25a on the front side 10F of the semiconductor substrate 10; and performing an etching process using the lower gas 273 provided into the process region PL in a direction from the lower holes 234 of the lower showerhead 230 toward the back side 10B of the semiconductor substrate 10 in the second back side process chamber 202b, to remove the back material layer 25b on the back side 10B of the semiconductor substrate 10. Here, the upper gas 263 may be an inert gas to be provided onto the front material layer 25a on the front side 10F of the semiconductor substrate 10 to prevent the front material layer 25a on the front side 10F of the semiconductor substrate 10 from being etched by the lower gas 273. Here, the lower gas 273 may be an oxygen ($O_2$). Thus, the back material layer 25b on the back side 10B of the semiconductor substrate 10 such as an amorphous carbon layer may be removed by an etching process using an oxygen ($O_2$) plasma. The etching process for removing the back material layer 25b on the back side 10B of the semiconductor substrate 10 may be a plasma etching process using a plasma formed using the lower gas 273 supplied from the second lower gas supply unit 270b and provided into the process region PL. For example, the lower gas 273 may be a process gas containing oxygen, and the plasma etching process may be an oxygen plasma etching process capable of removing an amorphous carbon layer.

Figure 16:
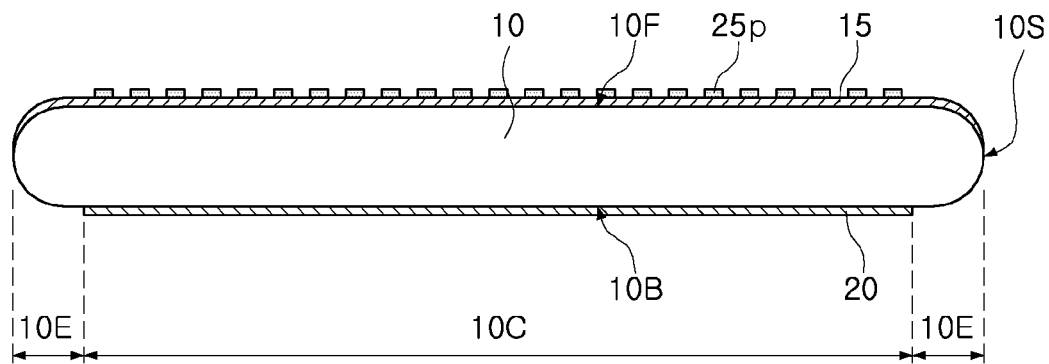
Figure 17:
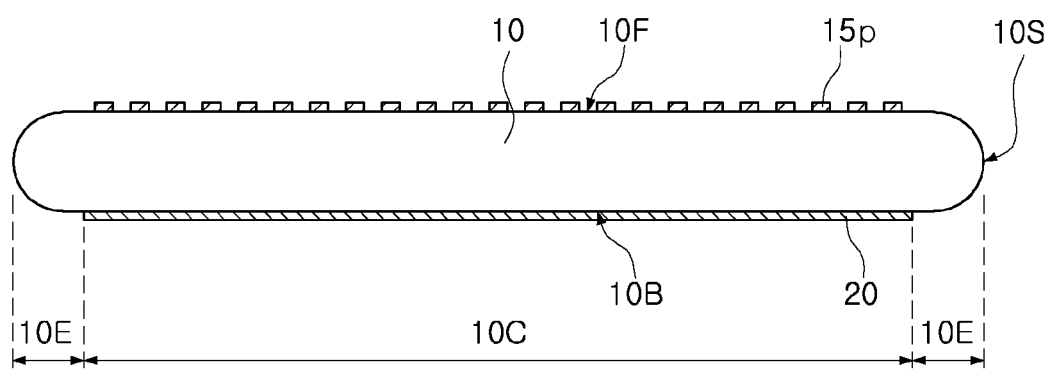

Referring to FIGS. 1, 16, and 17, a semiconductor process may be performed (S60). For example, the operation of performing the semiconductor process (S60) may include a photolithography process. For example, the operation of performing the semiconductor process (S60) may be a patterning process using a photolithography process and an etching process, and may include forming a material pattern 25p by patterning the material layer 25a on the front side 10F of the semiconductor substrate 10 may be patterned. When the material pattern 25p is used as an etching mask for etching a portion of the front side layer 15, the portion of the front side layer 15 may be etched using the material pattern 25p to form a front side pattern 15p.

After the portion of the front side layer 15 is etched or during the etching of the portion of the front side layer 15, the material pattern 25p may be removed. For example, the material pattern 25p may simultaneously be etched away by the etching process etching the front side layer 15. Alternatively, after the portion of the front side layer 15 is etched, an oxygen plasma etching process may be performed to remove the material pattern 25p.

Generally, a photolithography process for forming a fine pattern should be very precisely controlled. A bowing phenomenon such as warpage of a semiconductor substrate may occur, while forming a front side layer on a front side of the semiconductor substrate. When a photolithography process is performed using the semiconductor substrate having the bowing phenomenon as described above, it may fail to accurately chuck the semiconductor substrate in a photolithography process apparatus. When the photolithography process is performed using the thus incorrectly chucked semiconductor substrate, defects may occur. According to example embodiments, to prevent an occurrence of a bowing phenomenon such as warpage of the semiconductor substrate 10 due to the front side layer 15 or the front side pattern 15p formed on the front side 10F of the semiconductor substrate 10, the back side layer 20 may be formed on the back side 10B of the semiconductor substrate 10. Therefore, according to example embodiments of the present inventive concept, an occurrence of a bowing phenomenon such as warpage of the semiconductor substrate 10 or the like may be prevented.

The material layer 25 may be formed on at least a portion of the back side 10B of the semiconductor substrate 10, while forming the material layer 25 on the front side 10F of the semiconductor substrate 10. When such a material layer 25 is an amorphous carbon layer, the material layer 25 formed on the back side 10B of the semiconductor substrate 10 may become a source of contamination of a chuck directly facing the back side 10B of the semiconductor substrate 10 in a subsequent process apparatus such as a photolithography process apparatus for patterning the material layer 25. Alternatively, the material layer 25 formed on the back side 10B of the semiconductor substrate 10 may preclude a precise chucking of the semiconductor substrate 10 onto the chuck for the photolithography process apparatus. Example embodiments of the present inventive concept may provide a method of removing the material layer 25 formed on the back side 10B of the semiconductor substrate 10. Therefore, according to example embodiments, defects caused by the material layer 25 formed on the back side 10B of the semiconductor substrate 10 may be prevented.

According to example embodiments, the back side layer 20 may be formed on the back side 10B of the semiconductor substrate 10 using the same second process chamber, i.e., the back side process chamber 202, and the back material layer 25b formed on the back side 10B of the semiconductor substrate 10 may be removed. Therefore, in a method of fabricating a semiconductor device of the present inventive concept according to example embodiments, the productivity of the semiconductor device may be improved, while preventing the occurrence of defects due to the material layer 25 remaining on the back side 10B of the semiconductor substrate 10, since the deposition process and the etching process may be performed on the back side 10B of the semiconductor substrate 10 using one process chamber or the same type of process chamber.

According to example embodiments of the present inventive concept, a method of forming a semiconductor device using a back side of a semiconductor substrate, and a semiconductor processing apparatus capable of processing a back side of a semiconductor substrate may be provided.

According to an example embodiment of the present inventive concept, a bowing phenomenon such as warpage of a semiconductor substrate due to a front side layer or front pattern formed on a front side of the semiconductor substrate may be prevented by forming a back side layer on a back side of the semiconductor substrate.

According to an example embodiment of the present inventive concept, a batch type process chamber may be used to provide a method of forming a material layer on a front side and a back side of a semiconductor substrate. Since the batch type process chamber may process a plurality of semiconductor substrates, a large number of semiconductor substrates on which the material layer is formed may be formed. In a semiconductor substrate having a material layer formed using the batch type process chamber, a material layer on a front side of the semiconductor substrate may remain, and the material layer on the back side of the semiconductor substrate may be removed, by using a back side process chamber capable of processing the back side of the semiconductor substrate. Therefore, the productivity of the semiconductor device may be improved, while preventing the occurrence of defects due to the material layer remaining on the back side of the semiconductor substrate.

According to an example embodiment of the present inventive concept, a semiconductor processing apparatus including a process chamber capable of forming a back side layer on a back side of a semiconductor substrate by a deposition process, and capable of etching a material layer on a back side of a semiconductor substrate by an etching process may be provided. The productivity of the semiconductor device may be improved by providing a semiconductor processing apparatus including a process chamber capable of performing a deposition process and an etching process.

While example embodiments have been illustrated and described above, it will be apparent to those skilled in the art that modifications and variations could be made without departing from the scope of the present inventive concept as defined by the appended claims.

What is claimed is:

1. A method of fabricating a semiconductor device, the method comprising:

preparing a first semiconductor substrate having a front side and a back side, opposing each other;

forming a material layer on the first semiconductor substrate, wherein the material layer is formed on at least a portion of the back side of the first semiconductor substrate while being formed on the front side of the first semiconductor substrate;

removing the material layer formed on the at least a portion of the back side of the first semiconductor substrate while maintaining the material layer formed on the front side of the first semiconductor substrate; and performing a semiconductor process to fabricate the semiconductor device using the material layer remaining on the front side of the first semiconductor substrate, wherein the removing of the material layer formed on the at least a portion of the back side of the first semiconductor substrate comprises:

preparing a back side process chamber including a lower showerhead, an upper showerhead disposed on the lower showerhead and facing the lower showerhead, and a support structure in which at least a portion thereof is located between the lower showerhead and the upper showerhead;

loading the first semiconductor substrate into the back side process chamber, wherein the first semiconductor substrate is supported by the support structure, wherein the back side of the first semiconductor substrate supported by the support structure faces the lower showerhead in the back process chamber, and the front side of the first semiconductor substrate supported by the support structures faces the upper showerhead in the back side process chamber;

maintaining the material layer formed on the front side of the first semiconductor substrate while removing the material layer formed on at least a portion of the back side the first semiconductor substrate by an etching process, in the back side process chamber; and unloading the first semiconductor substrate in which the material layer remains on the front side, from the back side process chamber.

2. The method according to claim 1, wherein the material layer is formed of an amorphous carbon layer.

3. The method according to claim 1, wherein the forming of the material layer on the first semiconductor substrate comprises:

preparing one or more additional second semiconductor substrates each having a front side and a back side, opposing each other;

loading the first and second semiconductor substrates into a batch type process chamber, wherein the first and second semiconductor substrates are supported by a substrate support in the batch type process chamber, and the front side of each of the first and second semiconductor substrates is exposed;

forming the material layer on the front side of each of the first and second semiconductor substrates in the batch type process chamber, wherein the material layer is formed on the at least a portion of a back side of each of the first and second semiconductor substrates; and unloading the first and second semiconductor substrates from the batch type process chamber.

4. The method according to claim 3, wherein, when forming the material layer on the front side of each of the first and second semiconductor substrates in the batch type process chamber, the material layer is also formed on edge regions of each of the first and second semiconductor substrates, further comprising:

removing the material layer formed on the edge regions of each of the first and second semiconductor substrates, after unloading the first and second semiconductor substrates from the batch type process chamber.

5. The method according to claim 4, wherein the removing of the material layer formed on the edge regions of each of the first and second semiconductor substrates comprises:

loading each of the first and second semiconductor substrates on which the material layer is formed into an edge process chamber;

removing the material layer formed on the edge regions of each of the first and second semiconductor substrates by an etching process; and unloading the first and second semiconductor substrates from the edge process chamber.

6. The method according to claim 1, wherein the removing of the material layer formed on the at least a portion of the back side of the first semiconductor substrate is performed by using an oxygen ($O_2$) plasma.

7. The method according to claim 1, wherein the maintaining of the material layer formed on the front side of the first semiconductor substrate while removing the material layer formed on at least a portion of the back side of the first semiconductor substrate by an etching process, in the back side process chamber, comprises:

providing an inert gas in a direction from upper holes of the upper showerhead toward the front side of the first semiconductor substrate to protect the material layer formed on the front side of the first semiconductor substrate; and using a lower gas provided in a direction from lower holes of the lower showerhead toward the back side of the first semiconductor substrate to the material layer formed on the back side of the first semiconductor substrate.

8. A method of fabricating a semiconductor device, the method comprising:

preparing a semiconductor substrate having a front side and a back side, opposing each other;

forming a front side layer on the front side of the semiconductor substrate;

forming a back side layer on the back side of the semiconductor substrate;

forming a material layer on the semiconductor substrate on which the front side layer and the back side layer are formed, wherein the material layer is formed on the front side of the semiconductor substrate and formed on at least a portion of the back side of the semiconductor substrate;

maintaining the material layer formed on the front side of the semiconductor substrate while removing the material layer formed on the at least a portion of the back side of the semiconductor substrate; and performing a semiconductor process to fabricate the semiconductor device using the material layer remaining on the front side of the semiconductor substrate, wherein the forming of the front side layer on the front side of the semiconductor substrate comprises:

loading the semiconductor substrate into a front side process chamber, wherein the back side of the semiconductor substrate is in contact with a substrate support chuck in the front side process chamber, and the front side of the semiconductor substrate is exposed;

forming the front side layer on the front side of the semiconductor substrate in the front side process chamber; and unloading the semiconductor substrate on which the front side layer is formed from the front side process chamber.

9. The method according to claim 8, wherein the forming of the back side layer on the back side of the semiconductor substrate is performed in a first back side process chamber, wherein the material layer formed on the at least a portion of the back side of the semiconductor substrate is removed in a second back side process chamber, and wherein each of the first and second back side process chambers includes an upper showerhead having upper holes, a lower showerhead having lower holes, and a support structure between the upper showerhead and the lower showerhead.

10. The method according to claim 9, wherein the forming of the back side layer on the back side of the semiconductor substrate in the first back side process chamber comprises:

loading the semiconductor substrate into the first back side process chamber, wherein the back side of the semiconductor substrate faces the lower showerhead in the first back side process chamber, and the front side of the semiconductor substrate faces the upper showerhead in the first back side process chamber;

forming the back side layer on the back side of the semiconductor substrate in the first back side process chamber; and unloading the semiconductor substrate on which the back side layer is formed from the first back side process chamber, and wherein the removing of the material layer formed on the at least a portion of the back side of the semiconductor substrate in a second back side process chamber comprises:

loading the semiconductor substrate on which the material layer is formed into the second back side process chamber, wherein the back side of the semiconductor substrate on which the material layer is formed faces the lower showerhead in the second back side process chamber, and the front side of the semiconductor substrate on which the material layer is formed faces the upper showerhead in the second back side process chamber;

maintaining the material layer formed on the front side of the semiconductor substrate while removing the material layer formed on the at least a portion of the back side of the semiconductor substrate, in the second back side process chamber; and unloading the semiconductor substrate in which the material layer remains on the front side, from the second back side process chamber.

11. The method according to claim 8, wherein the performing of the semiconductor process comprises:

patterning the material layer remaining on the front side of the semiconductor substrate by a photolithography process and an etching process to form a material pattern, and etching a portion of the front side layer by an etching process using the material pattern as an etching mask to form a front pattern.

12. The method according to claim 11, further comprising:

removing the material pattern, after etching the portion of the front side layer, or during etching the portion of the front side layer.

13. A method of fabricating a semiconductor device, the method comprising:

preparing a first back side process chamber and a second back side process chamber, wherein each of the first and second back side process chambers includes a lower showerhead having lower holes, an upper showerhead disposed on the lower showerhead and having upper holes, and a support structure between the lower showerhead and the upper showerhead;

loading a first semiconductor substrate having a front side and a back side, opposing each other, into the first back side process chamber, wherein the back side of the first semiconductor substrate faces the lower showerhead in the first back side process chamber, and the front side of the first semiconductor substrate faces the upper showerhead in the first back side process chamber;

forming a back side layer on the back side of the first semiconductor substrate in the first back side process chamber;

unloading the first semiconductor substrate on which the back side layer is formed from the first back side process chamber;

forming a material layer on the first semiconductor substrate, wherein the material layer covers the front side of the first semiconductor substrate and covers at least a portion of the back side of the first semiconductor substrate;

loading the first semiconductor substrate on which the material layer is formed into the second back side process chamber, wherein the back side of the first semiconductor substrate on which the material layer is formed faces the lower showerhead in the second back side process chamber, and the front side of the first semiconductor substrate on which the material layer is formed faces the upper showerhead in the second back side process chamber;

maintaining the material layer formed on the front side of the first semiconductor substrate while removing the material layer formed on the at least a portion of the back side of the first semiconductor substrate, in the second back side process chamber; and unloading the first semiconductor substrate in which the material layer remains on the front side, from the second back side process chamber.

14. The method according to claim 13, wherein the forming of the back side layer on the back side of the first semiconductor substrate in the first back side process chamber comprises:

providing an inert gas in a direction from the upper holes of the upper showerhead toward the front side of the first semiconductor substrate in the first back side process chamber to protect the front side of the first semiconductor substrate; and using a deposition process gas provided in a direction from the lower holes of the lower showerhead toward the back side of the first semiconductor substrate in the first back side process chamber to form the back side layer on the back side of the first semiconductor substrate.

15. The method according to claim 13, wherein the maintaining of the material layer formed on the front side of the first semiconductor substrate while removing the material layer formed on the at least a portion of the back side of the first semiconductor substrate, in the second back side process chamber, comprises:
- providing an inert gas in a direction from the upper holes of the upper showerhead toward the front side of the first semiconductor substrate in the second back side process chamber to protect the material layer formed on the front side of the first semiconductor substrate; and
- providing an etching process gas in a direction from the lower holes of the lower showerhead toward the back side of the first semiconductor substrate in the second back side process chamber to remove the material layer formed on the at least a portion of the back side of the first semiconductor substrate.

16. The method according to claim 13, wherein the forming of the material layer on the first semiconductor substrate comprises:
- preparing one or more additional second semiconductor substrates on which the back side layer is formed by using the first back side process chamber;
- loading the first and second semiconductor substrates into a batch type process chamber;
- forming the material layer on each of the first and second semiconductor substrates in the batch type process chamber; and
- unloading the first and second semiconductor substrates on which the material layer is formed from the batch type process chamber.

17. The method according to claim 16, wherein, when forming the material layer on each of the first and second semiconductor substrates in the batch type process chamber, the material layer is also formed on edge regions of each of the first and second semiconductor substrates,
- wherein the forming of the material layer on each of the first and second semiconductor substrates further comprises:
- loading each of the first and second semiconductor substrates unloaded from the batch type process chamber into an edge process chamber;
- maintaining the material layer on the front side and the back side of each of the first and second semiconductor substrates while removing the material layer on the edge regions of each of the first and second semiconductor substrates, in the edge process chamber; and
- unloading the first and second semiconductor substrates from which the material layer on the edge regions is removed, from the edge process chamber.

18. The method according to claim 13, further comprising:
- forming a material pattern by patterning the material layer remaining on the front side of the first semiconductor substrate.

* * * * *